(12) United States Patent
Schifmann et al.

(10) Patent No.: US 11,705,916 B2
(45) Date of Patent: Jul. 18, 2023

(54) DIFFERENTIAL SOURCE FOLLOWER WITH CURRENT STEERING DEVICES

(71) Applicant: Intel Corporation, Santa Clara, CA (US)

(72) Inventors: Yitzhak Elhanan Schifmann, Beit Horon (IL); Yoel Krupnik, Jerusalem (IL); Ariel Cohen, Modiin-Makkabbim-Reut (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/717,558

(22) Filed: Apr. 11, 2022

(65) Prior Publication Data

US 2022/0239305 A1    Jul. 28, 2022

Related U.S. Application Data

(60) Division of application No. 16/985,104, filed on Aug. 4, 2020, now Pat. No. 11,329,662, which is a continuation of application No. 16/285,060, filed on Feb. 25, 2019, now Pat. No. 10,742,227.

(51) Int. Cl.

| | |
|---|---|
| *H03M 1/12* | (2006.01) |
| *H03F 3/213* | (2006.01) |
| *H03F 3/68* | (2006.01) |
| *H03M 1/38* | (2006.01) |
| *H04B 1/16* | (2006.01) |
| *G11C 27/02* | (2006.01) |

(52) U.S. Cl.
CPC ............. *H03M 1/121* (2013.01); *G11C 27/02* (2013.01); *H03F 3/213* (2013.01); *H03F 3/68* (2013.01); *H03M 1/1245* (2013.01); *H03M 1/38* (2013.01); *H04B 1/16* (2013.01); *H03F 2200/129* (2013.01); *H03F 2200/231* (2013.01); *H03F 2200/267* (2013.01); *H03F 2200/69* (2013.01)

(58) Field of Classification Search
CPC ...................................................... H03M 1/121
USPC ........................................................ 375/318
See application file for complete search history.

(56) References Cited

U.S. PATENT DOCUMENTS

| | | | |
|---|---|---|---|
| 9,432,000 B1 | 8/2016 | Gorecki et al. | |
| 10,742,227 B1 | 8/2020 | Schifmann et al. | |
| 2006/0232462 A1* | 10/2006 | Nakajima | ........... H03M 1/0604 341/164 |

(Continued)

FOREIGN PATENT DOCUMENTS

| | | |
|---|---|---|
| KR | 1020050017914 | 2/2005 |
| WO | 2007110817 | 10/2007 |

OTHER PUBLICATIONS

Final Office Action dated Jan. 29, 2020 for U.S. Appl. No. 16/285,060.
International Search Report & Written Opinion dated May 8, 2020 for PCT Patent Application No. PCT/US2020/013385.

(Continued)

*Primary Examiner* — Lihong Yu
(74) *Attorney, Agent, or Firm* — Schwabe, Williamson & Wyatt, P.C.

(57) ABSTRACT

Describe is a buffer which comprises: a differential source follower coupled to a first input and a second input; first and second current steering devices coupled to the differential source follower; and a current source coupled to the first and second current steering devices. The buffer provides high supply noise rejection ratio (PSRR) together with high bandwidth.

16 Claims, 9 Drawing Sheets

(56) References Cited

U.S. PATENT DOCUMENTS

| | | |
|---|---|---|
| 2008/0048896 A1 | 2/2008 | Parthasarthy et al. |
| 2009/0289716 A1* | 11/2009 | Jaeger ................ H03F 3/45183 330/261 |
| 2010/0070798 A1 | 3/2010 | Cornwell et al. |
| 2010/0231266 A1 | 9/2010 | Kishor |
| 2011/0158524 A1 | 6/2011 | Ohba et al. |
| 2012/0176259 A1 | 7/2012 | Sanduleanu et al. |
| 2013/0033326 A1 | 2/2013 | Acosta-Serafini et al. |
| 2014/0029143 A1 | 1/2014 | Lim et al. |
| 2015/0318829 A1 | 11/2015 | Astgimath |
| 2016/0054447 A1 | 2/2016 | Sun et al. |
| 2016/0359459 A1 | 12/2016 | Zhu et al. |
| 2017/0272234 A1 | 9/2017 | Zhu et al. |
| 2018/0332377 A1 | 11/2018 | Polo et al. |
| 2019/0028236 A1 | 1/2019 | Tonietto et al. |

OTHER PUBLICATIONS

Non-Final Office Action dated Sep. 27, 2019 for U.S. Appl. No. 16/285,060.

Notice of Allowance dated Apr. 10, 2020 for U.S. Appl. No. 16/285,060.

Lopez-Martin, A.J., "Power-efficient analog design based on the class AB super source follower", in Int. J. Circ. Theor. Appl. 2012; vol. 40, Iss. 11; pp. 1143-1163.

Razavi, B., "Design of analog CMOS integrated circuits", [textbook], Published by McGraw-Hill Education, NY, NY, 2nd Ed., Original copyright 2017, previous edition copyright 2001. ISBN 978-0-07-252493-2. pp. 68-73, and 188-193.

Non-Final Office Action dated Sep. 1, 2021 for U.S. Appl. No. 16/985,104, 23 pages.

Notice of Allowance dated Jan. 12, 2022 for U.S. Appl. No. 16/985,104, 23 pages.

* cited by examiner

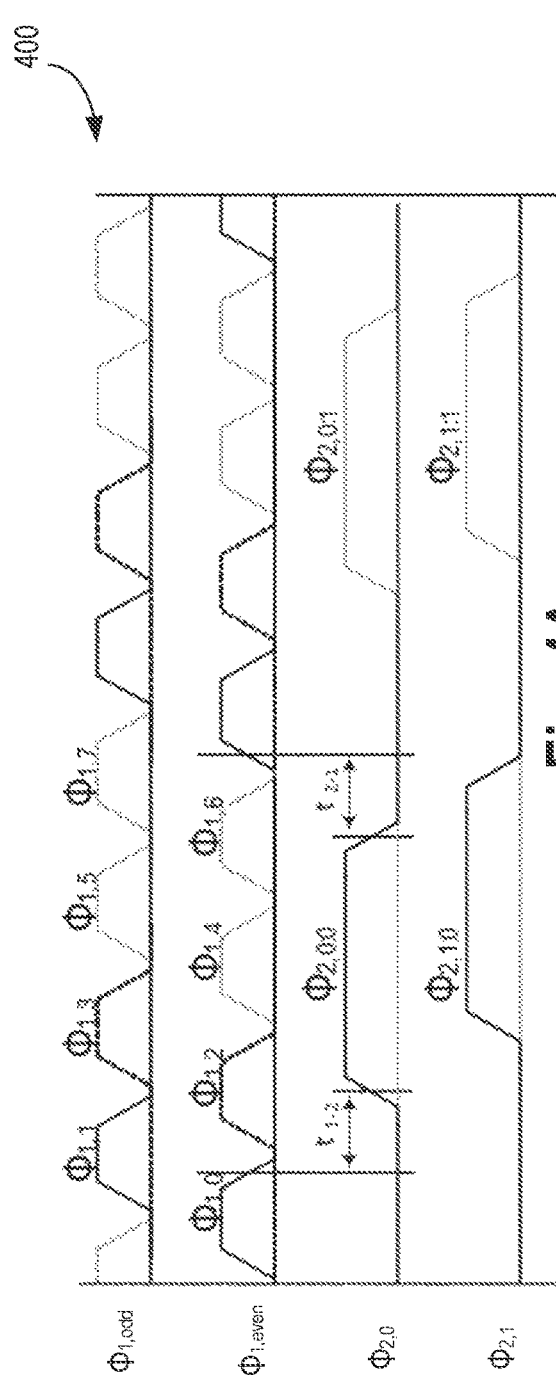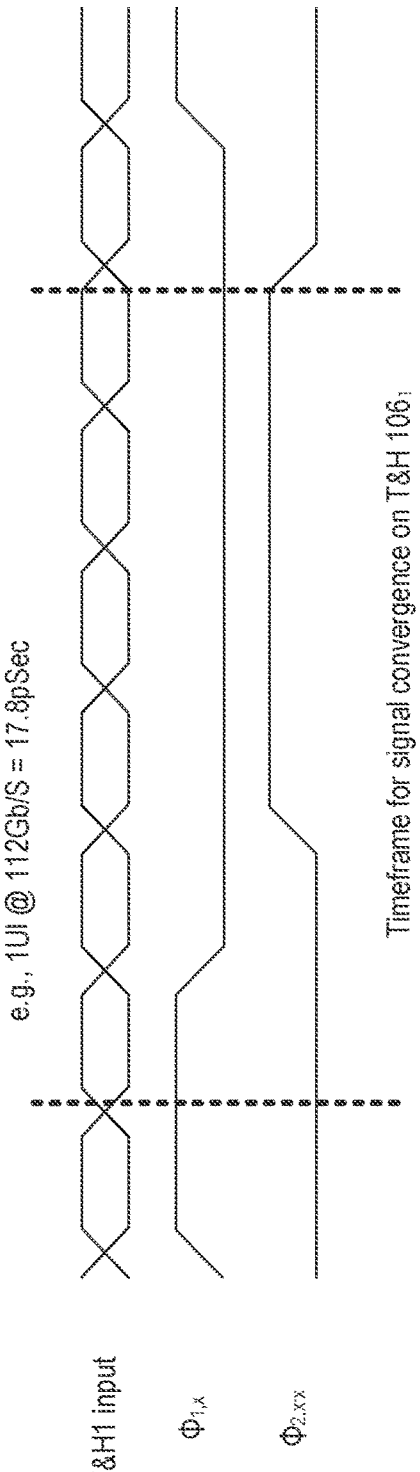
Fig. 4A
Fig. 4B

DIFFERENTIAL SOURCE FOLLOWER WITH CURRENT STEERING DEVICES

PRIORITY CLAIM

This application is: (a) a divisional of pending U.S. patent application Ser. No. 16/985,104, filed Aug. 4, 2020, which in turn is a continuation of (b) U.S. patent application Ser. No. 16/285,060, filed on Feb. 25, 2019, now U.S. Pat. No. 10,742,227, issued Aug. 11, 2020, both of which are titled, "Differential Source Follower with Current Steering Devices" and incorporated herein by reference in their entirety.

BACKGROUND

Existing buffers are challenging to design when competing performance parameters are desired to be maximized. For example, designing a buffer that can reject noise injected from a power supply rail connected to the buffer while providing high bandwidth for propagating an input signal from an input node of the buffer to its output node, while reducing inter-symbol interference (ISI), is challenging. Further, reducing power consumption of buffers is also needed because buffers are used in many places in a system-on-chip (SOC). Existing buffers when used in high bandwidth time interleaving analog-to-digital converters (TI ADCs), suffer from low power supply rejection ratio (PSRR), feedback induced memory effect (FME), and low ISI rejection.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A-B illustrates a timing diagram of the time-interleaved analog-to-digital converter (TI ADC), and a timeframe showing that the buffer convergence ends at the sampling moment, e.g., the falling edge of a control signal of a second track and hold circuitry.

DETAILED DESCRIPTION

Figure 1:
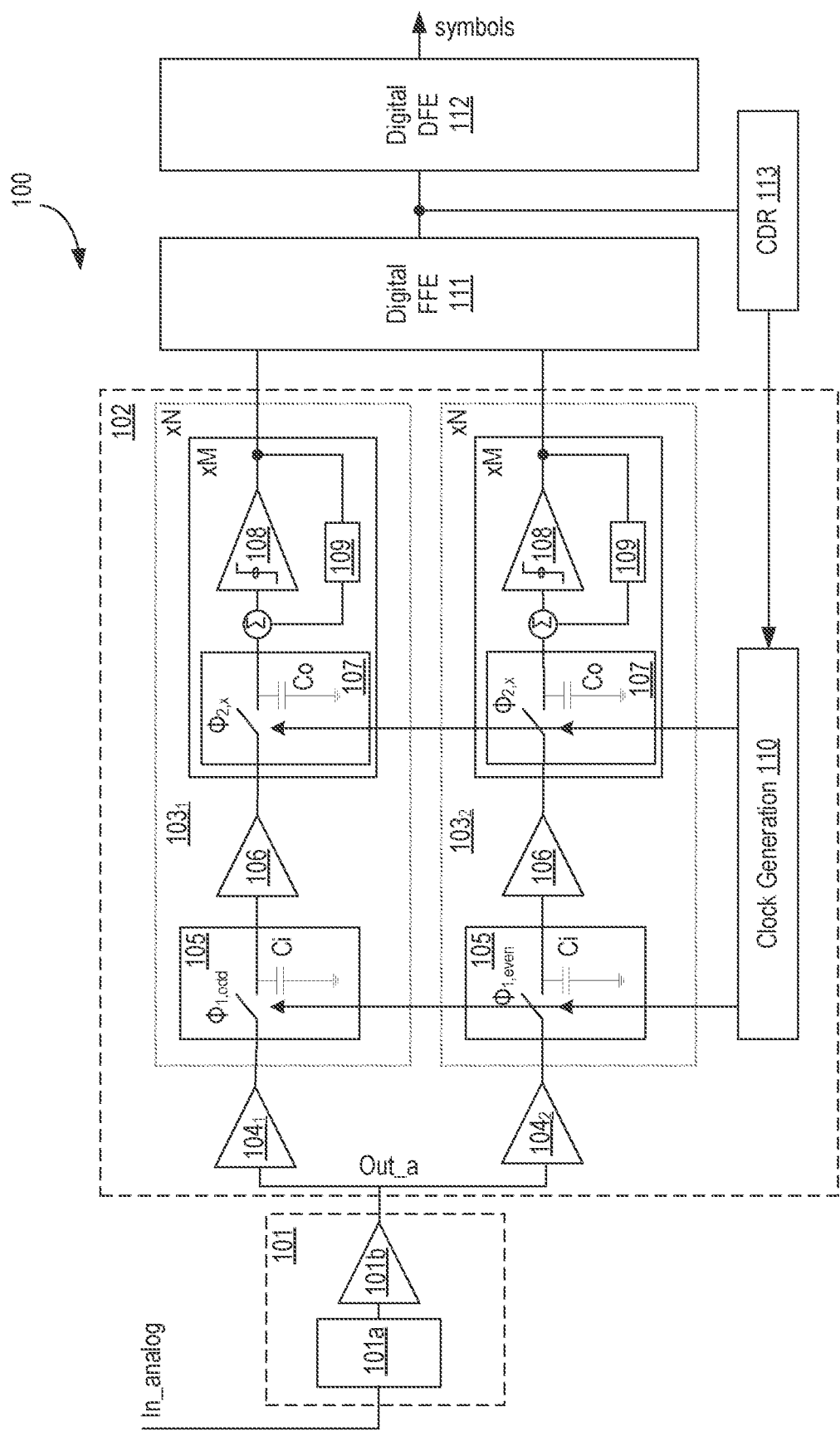
FIG. 1 illustrates a receiver architecture with a differential buffer having high bandwidth and high power supply rejection ratio (PSRR), in accordance with some embodiments.

The raising demand to transfer large data quantities over the internet and inside data centers is constantly pushing the industry towards increased data delivery rates over wireline communication systems. State-of-the-art transceiver systems nowadays reach data rates as high as 112 Gb/s (Giga bits per second). The bandwidth (BW) limitation of the communication channels and of the integrated circuits (ICs) pose significant challenges to the traditional signaling architectures, such as NRZ (non-return-to-zero), in which a signal is transmitted utilizing two voltage levels only. This has encouraged the development of multilevel signaling modulation formats, such as Pulse Amplitude Modulation (PAM). In PAM-4, a signal is transmitted utilizing four distinguished voltage levels, thus halving the required channel BW and the IC's clock frequency. The use of PAM-4 requires a paradigm shift in the architecture of these ultra-high speed serial-deserializer (SerDes) receivers, typically to an architecture based on high BW Time Interleaved (TI) analog to digital converters (ADCs). Such architectures, besides being suitable to the non-digital nature of the PAM-4 signaling, also deliver high performance over prior architectures in terms of performance and scalable design.

In TI ADCs, many sub ADCs are instantiated in parallel, such that the input signal alternates between the sub ADCs. Each sub ADC has thus a full alternation cycle in order to convert the input signal to the corresponding digital code. A signal distribution tree network of Track and Hold (T&H) blocks is used to distribute the input signal to each of the interleaved sub-ADCs in a timely manner, such that the sampled analog signal is stored at the input to the sub ADC throughout its conversion period. When the system's sampling frequency is high, a tree of depth greater than 1 (n>1) is used, due to the limited system bandwidth and clock speed. The buffers comprising this network play an important role to the overall system performance as any signal distortion produced by the buffers is translated to an error in the digital value converted by the ADC. Further, since the buffers are instantiated multiple times in the network, its power consumption is an important contributor to the overall system's power consumption.

Some embodiments describe differential, source-following based architecture for a buffer. In some embodiments, the buffer comprises a differential source follower coupled to a first input and a second input. The first and second inputs together form the differential input. The buffer comprises first and second current steering devices coupled to the differential source follower. A current source is coupled to the first and second current steering devices. In some embodiments, the buffer comprises a first capacitor coupled to the first current steering device and the differential source follower; and a second capacitor coupled to the second current steering device and the differential source follower. In some embodiments, the buffer comprises a bias generator to generate bias for the differential source follower. In various embodiments, the buffer comprises: a third capacitor coupled to the first input and the second current steering device; and a fourth capacitor coupled to second input and the second current steering device. The fourth capacitor is coupled to a first output, and the third capacitor is coupled to a second output. The differential source follower of various embodiments is a differential class AB source follower. In some embodiments, the buffer comprises a fifth capacitor, which is coupled to a gate terminal and a source terminal of the current source.

In some embodiments, the differential source follower comprises first and second source followers. The first source follower includes: a p-type device coupled in series with the first current steering device, and also coupled to the first input; and an n-type device coupled in series with the p-type device, wherein the n-type device is biased by the bias from the bias generator, wherein drain terminals of the p-type and the n-type devices are coupled to the first capacitor. The second source follower includes: a p-type device coupled in series with the second current steering device, and also coupled to the second input; and an n-type device coupled in series with the p-type device, wherein the n-type device is biased by the bias from the bias generator, wherein drain terminals of the p-type and the n-type devices are coupled to the second capacitor. The gate terminal of the first current steering device is coupled to a first resistor, which is coupled to a bias. In some embodiments, the gate terminal of the second current steering device is coupled to a second resistor, which is coupled to the bias. In some embodiments, the first source follower includes another n-type device having a gate terminal coupled to the drain terminals of the p-type and n-type devices of the first source follower. The gate of this additional n-type device is also coupled to the first capacitor. The drain of this additional n-type device is coupled to the first current steering device and the p-type transistor of the first source follower. In some embodiments, the second source follower includes another n-type device having a gate terminal coupled to the drain terminals of the p-type and n-type devices of the second source follower. The gate of this additional n-type device is also coupled to the second capacitor. The drain of this additional n-type device is coupled to the second current steering device and the p-type transistor of the second source follower.

There are many technical effects of the various embodiments. For example, the differential source follower-based buffer substantially improves the weak points of the prior art buffers. For example, the differential source follower-based buffer has the same bandwidth or higher than a bandwidth of a cascode-type source follower, but for about 40% of its power consumption, or for the same power as a typical source follower, the buffer of various embodiments can have about 2× bandwidth of the typical source follower, together with higher performance in other areas. For example, the buffer of various embodiments has higher PSRR compared to the PSRR of a typical source follower (e.g., the PSRR increases from −42 dB to −56 dB). The buffer of various embodiments has a substantially reduced feedback induced memory (FME) compared to the FME of a typical source follower, due to input-to-inverted-output capacitors. The buffer of various embodiments has negligible mismatch sensitivity, due to a DC loop driving an operating point to a high impedance node. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" also refers to upsizing a design and layout. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates a receiver architecture 100 with a differential buffer having high bandwidth, high power supply rejection ratio (PSRR), in accordance with some embodiments. Receiver architecture 100 comprises an analog front-end (AFE) 101, interleaved successive approximation (SAR) analog-to-digital converter (ADC) 102, digital signal processing logic including digital feed-forward equalizer 111, digital decision feedback equalizer 112, and clock data recovery (CDR) circuitry 113.

In some embodiments, AFE 101 comprises a matching network 101a. Matching network 101a includes passive and/or active devices that provide termination impedance matched with the impedance of the transmission media coupled to matching network 101a. Matching network 110a may also include electrostatic discharge (ESD) device(s). Matching network 110a is coupled to amplifier 101b. In some embodiments, amplifier 101b is a multistage continuous time linear equalizer (CTLE). A differential analog signal, In_analog, is received by matching network 110a, and this signal is then equalized by CTLE 101b. An analog signal is any continuous signal for which the time varying feature (variable) of the signal is a representation of some other time varying quantity, i.e., analogous to another time varying signal. One such architecture of the multistage CTLE is described with reference to FIG. 2.

Figure 2:
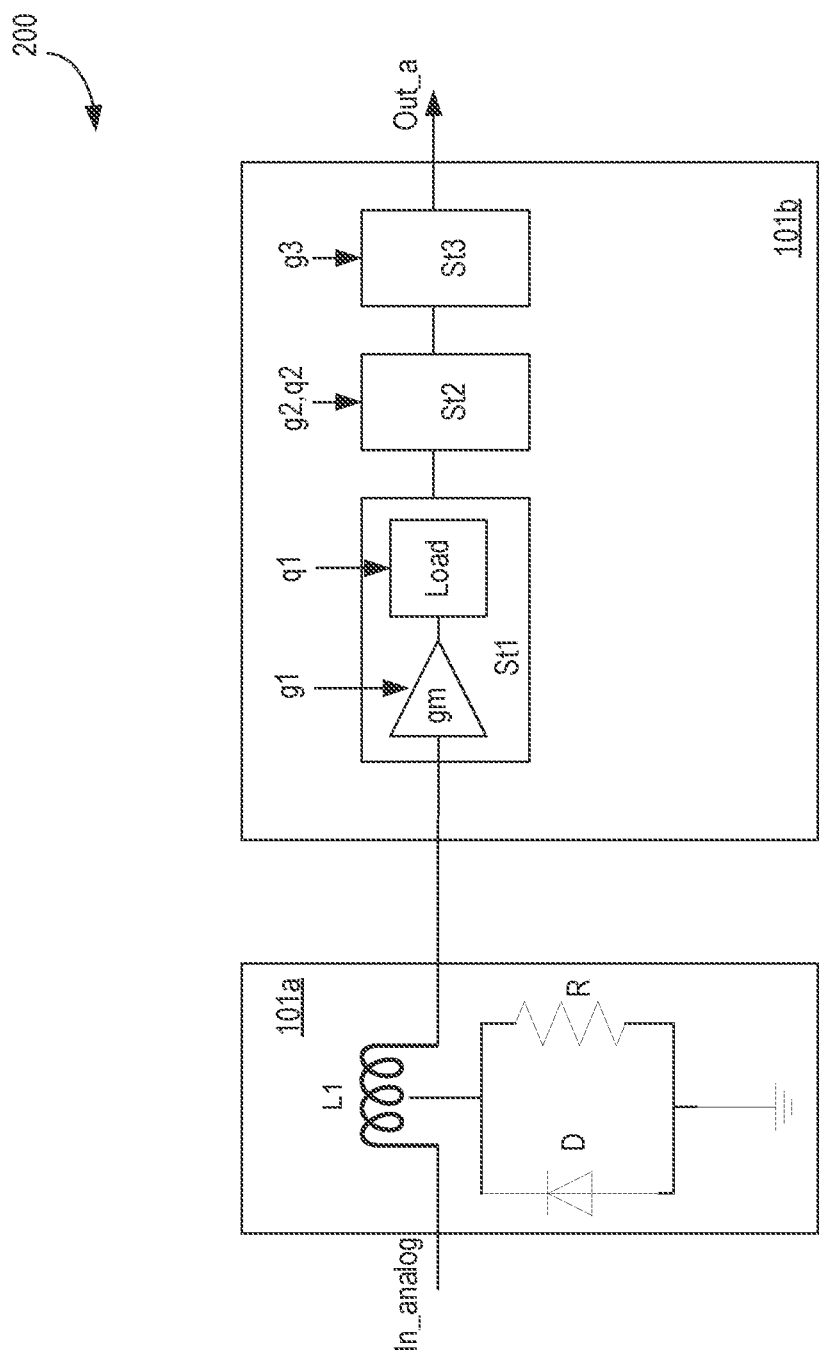
FIG. 2 illustrates an analog frontend (AFE) circuitry for use in the receiver of FIG. 1, in accordance with some embodiments.

FIG. 2 illustrates an AFE circuitry 200 for use in the receiver of FIG. 1. AFE circuitry 200 comprises matching network 101a with passive (and/or active) elements such as inductor, resistor, diode, capacitor, etc. In some embodiments, amplifier 101b comprises three gain stages St1, St2, and St3. The first two stages, St1 and St2, in this example provide high frequency equalization while the following third stage St3 provides flat gain. Here, g1, g2, and g3 are the gains for the first (St1), second (St2), and third (St3) gain stages, respectively, while q1 and a2 are the loads with controllable quality factor for the first (St1) and second (St2) gain stages, respectively.

In some embodiments, every stage in circuitry 200 employs a differential pair with an RLC load network except for the last stage (St3). In some embodiments, the gm (trans-conductance) stage is built using complementary structure. This structure may use higher supply voltage (e.g., 20% higher), but reduces bias current by half, resulting in about 40% power savings. In some embodiments, linear equalization is performed using Q-shaping technique, by controlling resistance value of the passive RLC load network. As the quality factor (Q-factor) is determined by the resistance value and the resonance frequency is determined by the L and C, higher Q-factor increases the gain at resonance frequency and reduces the DC gain. This configuration can be tuned (e.g., for 25 dB gain) at peak frequency (e.g., of 25 Ghz) and total boost from DC to peak of up to, for example, 30 dB.

Referring back to FIG. 1, the output of AFE 101 is a differential output, Out_a. The differential output includes two signal components, which are complementary of each other. These components are received by SAR ADC 102 (e.g., a 64-way time interleaved 56 GS/s), which comprises buffers $104_1$ and $104_2$, time interleave sampling structures $103_{1-2}$, and clock generation circuitry 110. In various embodiments, each of the time interleave sampling structures $103_{1-2}$ comprises a first track-and-hold ($T\&H_1$) circuitry 105, buffer 106, second $T\&H_2$ circuitry 107 coupled to an ADC (e.g., components 108, 109). Each T&H circuitry comprises a switch, which is controllable by a clock, and a capacitor. The switches can be implemented as p-type, n-type, or both types of transistors.

The output of buffer $104_1$ is received by $T\&H_1$ 105 of $103_1$. The switch of $T\&H_1$ 105 is controlled by an odd phase of clock, where the switch is coupled to an input capacitor Ci. The output of buffer $104_2$ is received by $T\&H_1$ 105 of $103_2$. For $T\&H_1$ 105 of $103_2$, the switch is controlled by an even phase of clock, where the switch is coupled to an input capacitor Ci. The output of each $T\&H_1$ 105 is buffered by its corresponding buffer 106. The output of this buffer 106 is then received by M number of T&H circuitries and ADCs. For example, the output of buffer 106 is received by 8 copies of T&H circuitries and ADCs. For a 64-way time interleaved ADC logic 102, four copies of $103_1$ are used. For instance, N=4 and M=8 for a 64-way time interleaved logic 102.

In various embodiments, ADC 102 is implemented using a cascaded sampling architecture with a depth of two comprised of two sets of sampling switches ($T\&H_1$ and $T\&H_2$) as shown in FIG. 1. In one example, to reduce the output load of buffer $104_1$, the sampling switches ($T\&H_1$ 105) are clocked using eight 25% duty-cycle, 7 GHz clocks ($\Phi_{1,1}$ ... $\Phi_{1,8}$) spaced apart by unit time step equivalent to 56 GHz. Buffers $104_{1-2}$ can be implemented as typical source followers (SF). To minimize the ISI and reduce the $T\&H_1$ 105 kickbacks onto buffer $104_1$ ($SF_1$), two buffers are used to drive the $T\&H_1$ 105 switches (of both $103_{1-2}$) which are split into two set of switches each driven by non-overlapping clocks ($\Phi_{1,odd}$ and $\Phi_{1,even}$).

FIG. 4A illustrates a timing diagram 400 time-interleaved analog-to-digital converter (ADC) of FIG. 1, in accordance with some embodiments. The sampled output of $T\&H_1$ 105 gets buffered using buffer 106 and sampled using the second set of sampling switches ($T\&H_2$ 107) located inside the individual SARs (e.g., M copies of SARs). In some embodiments, the switches of $T\&H_2$ 107 are driven by 64 clocks ($\Phi_{2,0:0}, \Phi_{2,0:1}$ ... $\Phi_{2,7:6}, \Phi_{2,7:7}$). In one example, the clocks are generated by block 110 by feeding eight 7 GHz clocks $\Phi_{2,0}$ ... $\Phi_{2,7}$) to a set of eight SARs connected to the same buffer 106 output. In some embodiments, the clock is divided internally between the SARs using a distributed shift register (not shown) to $\frac{1}{8}^{th}$ the speed. The output of $T\&H_2$ 107 is then converted into a digital representation by quantizer 107 and digital-to-analog converter (DAC) 109. The digital representation is a physical signal that is a representation of a sequence of discrete values (a quantified discrete-time signal), for example of an arbitrary bit stream, or of a digitized (sampled and analog-to-digital converted) analog signal.

In some embodiments, DAC 109 is an apparatus that converts digital data (e.g., binary or thermometer coded) into an analog signal (current, voltage, or electric charge). In some embodiments, DACs 109 are pulse width modulator DACs. In other embodiments, other types of DACs may be used for implementing DACs 109. For example, interpolating DACs (also known as oversampling DACs), binary weighted DACs (e.g., switched resistor DACs, switched capacitor DACs, switched current-source DACs), R-2R ladder DAC, thermometer coded DAC, segmented DAC, etc. may be used for implementing DACs 109. Any suitable DAC may be used for implementing DACs 109.

In some embodiments, quantizer 108 converts continuous physical quantities (e.g., voltages) to digital numbers that represent the amplitude of the physical quantities. In some embodiments, quantizers or ADCs 108 convert the analog output of $T\&H_2$ 107 to their corresponding digital representations. Any suitable ADC may be used to implement ADCs 108. For example, ADC 108 is one of: direct-conversion ADC (for flash ADC), two-step flash ADC, successive-approximation ADC (SAR ADC), ramp-compare ADC, Wilkinson ADC, integrating ADC, delta-encoded ADC or counter-ramp, pipeline ADC (also called subranging quantizer), sigma-delta ADC (also known as a delta-sigma ADC), time-interleaved ADC, ADC with intermediate FM stage, or time-stretch ADC. For purposes of explaining the various embodiments, ADCs 108a are considered to be flash ADCs.

The SAR quantizer 108 of FIG. 1, which has M copies, is illustrated as a simple circuit. In some embodiments, the SAR quantizer 108 comprises a dual comparator SAR ADC. A dual comparator SAR ADC provides superior performance when compared with a single comparator SAR, for example. The SAR utilizes two comparators, which are alternated in order to reduce the load for each of the comparators, and ease the setup and reset timing requirements for the comparators and their reliability constrains. The SAR is clocked asynchronously (each cycle is triggered by the completion of the previous cycle), which provides optimal operating speeds while consuming less power. In some embodiments, the calibration of the comparator's offset is done adaptively in the background based on the received data statistics without the requirement of extra cycles for calibration.

The clocks for T&H circuitries may be provided by clock generation block 110. Clock generation block 110 may be a delay line that receives an input clock from a clock data recovery (CDR) circuitry 113 and generates the various phases for controlling the switching of T&H circuitries 105 and 107. For M=8, eight phases of clocks (e.g., 7 GHz clocks) are generated by circuitry 110. These clocks may have 50% duty cycle. In various embodiments, the delay line is tunable with a certain resolution (e.g., 1.5 ps). The output of the delay line may be fed into a set of phase interpolators (not shown) for further more accurate phase tuning with a finer resolution (e.g., less than 200 fs). The duty cycle of the outputs of the phase interpolators can be adjusted (e.g., reduced to 25%) using a current starvation technique on the non-sampling edge, allowing for duty cycle control with minimal impact over sampling spacing times.

In some embodiments, the clocks $\Phi_{2,0}$ ... $\Phi_{2,7}$ (e.g., 7 GHz clocks) which drive the $T\&H_2$ 107 of the ADC, are generated by feeding the 50% duty-cycle output clock of the PI to a multiplexer (e.g., 6:1 multiplexer) responsible for choosing the coarse delay between $\Phi_1$ clocks and the corresponding $\Phi_2$ clocks. Further duty-cycle and fine delay control are obtained from programmable delay elements of circuitry 110.

Due to the large load presented by the SAR (e.g., blocks 108, 109), the required settling time for $T\&H_2$ is increased compared of that for $T\&H_1$ 105. Consequently, the 7 GHz clocks ($\Phi_{2,0}$ ... $\Phi_{2,7}$) may have a 50% tunable duty-cycle. The phase of the clocks is tuned to ensure non-overlap between each $\Phi_1$ and the corresponding $\Phi_2$ indicated by the times $t_{1-2}$ and $t_{2-1}$. An overlap between $\Phi_2$ and the previous $\Phi_1$ would lead to bandwidth reduction in $T\&H_1$ as well as higher kickback seen by buffers $104_{1-2}$, while an overlap with the next $\Phi_1$ would result, in addition to the aforementioned, in significant ISI.

In some embodiments, buffers $104_{1-2}$ are conventional source followers. Conventional source followers comprise two p-type devices in series, where a first p-type device has a gate terminal coupled to one signal component of Out_a input, while the output a second p-type device is biased by a fixed or programmable bias (e.g., pbias). The drain of the first p-type is coupled to ground while the source of the second p-type device is coupled to a supply node (e.g. Vcc). The source terminal of the first p-type device and the drain terminal of the second p-type device provide the output. Conventional source followers are high power consuming devices.

In some embodiments, to improve the slew rate and bandwidth of the source follower, a class AB source follower is used for first source followers $104_{1-2}$. In one such example, class AB source follower comprises the same two p-type devices as the conventional source followers, but with an addition of an n-type device coupled in series with the first p-type device. The n-type device is biased by another bias (e.g., nbias). To improve the voltage headroom of the conventional source follower, the second p-type device gates are AC coupled to the drain terminals of the first p-type device and the n-type device. The source of the n-type device is coupled to ground. The class AB source follower results in a better bandwidth to power tradeoff compared to conventional source followers.

However, this class AB source follower is not suitable for use in the second buffers 106 because this class AB source follower suffers from a poor power supply rejection ratio (PSRR) due to the pseudo differential common source portion.

In various embodiments, to improve the PSRR for buffer 106, a current source is added to form a differential amplifier or differential source follower as discussed with reference to FIG. 7. In the differential source follower, in some embodiments, to keep devices at a proper operating mode, a bias feedback loop is added to balance bias voltages provided to p-type and n-type transistors. As a result, power of 2× reduction is realized compared to a single-ended source follower.

Figure 3:
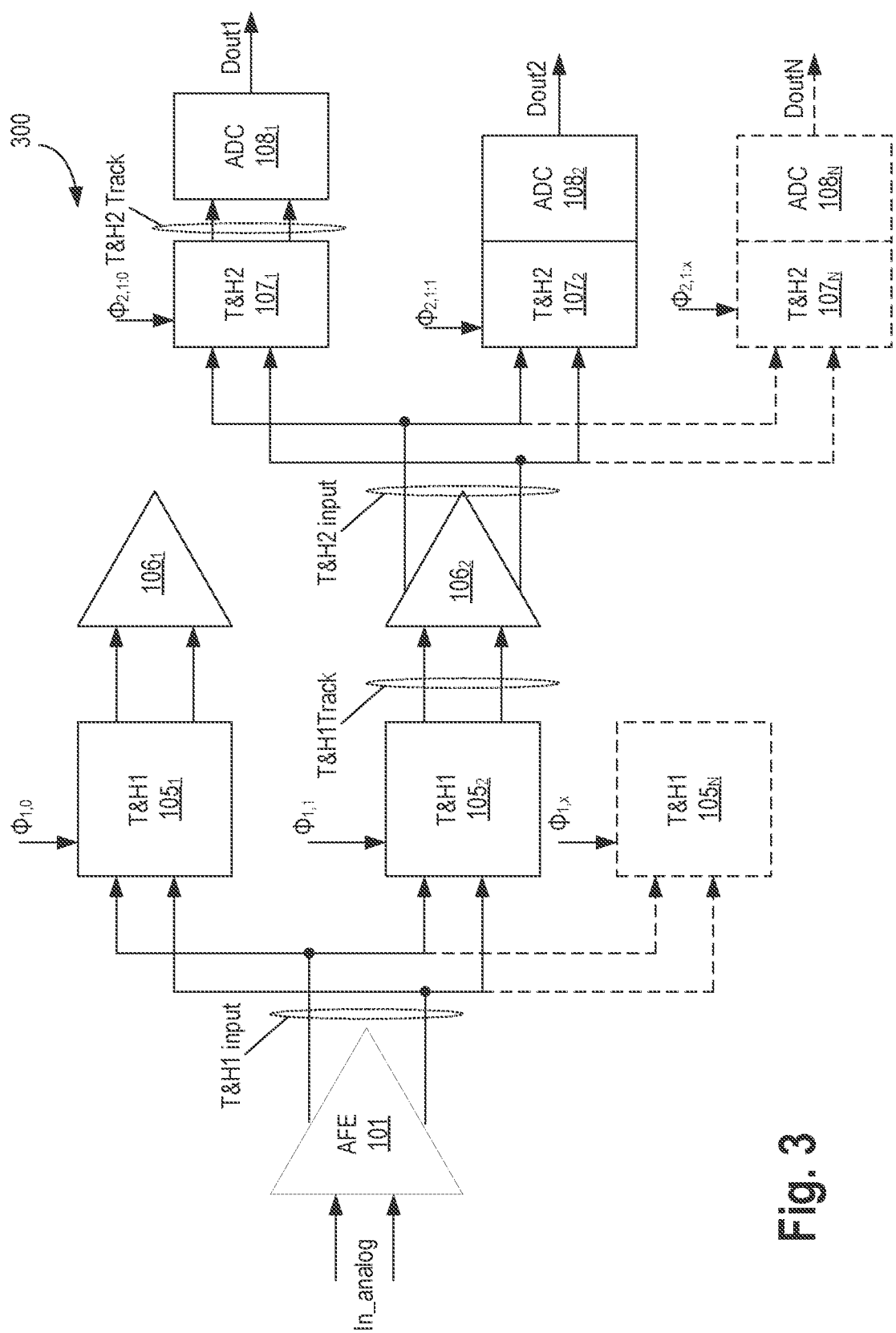
FIG. 3 illustrates a serial-deserializer receiver having the differential buffer, in accordance with some embodiments.

FIG. 3 illustrates a serial-deserializer receiver 300 having the differential buffer, in accordance with some embodiments. Receiver 300 is another view of architecture 100. The analog input, In_analog, is a differential signal (e.g., 122 Gb/s input PAM4 differential signal).

In TI ADCs, many sub ADCs $108_{1-N}$ are instantiated in parallel, such that the input signal alternates between the sub ADCs. Each sub ADC has thus a full alternation cycle to convert the input signal to the corresponding digital code. A signal distribution tree of Track and Hold (T&H) blocks $105_{1-N}$ and $107_{1-M}$ is used to distribute the input signal to each of the interleaved sub-ADCs in a timely manner, such that the sampled analog signal is stored at the input to the sub ADC throughout its conversion period. For example, the output of AFE 101 is buffered by a first set of source followers 104 (not shown here), and the buffered differential signals are provided to a first set of T&H circuits $T\&H_1$ $105_{1-N}$. Note, 'N' and 'M' are integers, where N and M can be equal or unequal numbers. Each T&H circuit in the signal distribution tree provides its differential output to another buffer (e.g., $106_{1-N}$). For instance $T\&H_1$ $105_2$ output is buffered by buffer $106_2$. When the system's sampling frequency is high, a tree of depth greater than 1 (e.g., n>1) is used, due to the limited system bandwidth and clock speed.

In FIG. 3 the distribution tree has a depth of 2 (e.g., N=2), for a PAM4 112 Gb/2 receiver. In this scheme, after the signal is sampled on each of the 8 $T\&H_1$ $105_{1-2}$, an analog buffer (e.g., $106_2$) drives it to one of 8 alternating $T\&H_2$ such that in total 8×8 SAR (successive approximation) sub ADCs are interleaved. Since the sampling element of the T&H blocks is a capacitor, a nested buffer is implemented between $T\&H_1$ and $T\&H_2$ to drive $T\&H_2$ and charge its capacitor to a required voltage level during its Track phase.

This makes buffer 106 important to the performance of the overall TI ADC system, as any signal distortion produced by it is translated to an error in the digital value converted by the ADC. In addition, since the buffer is instantiated multiple times, its power consumption is an important contributor to the overall system's power consumption.

Figure 7:
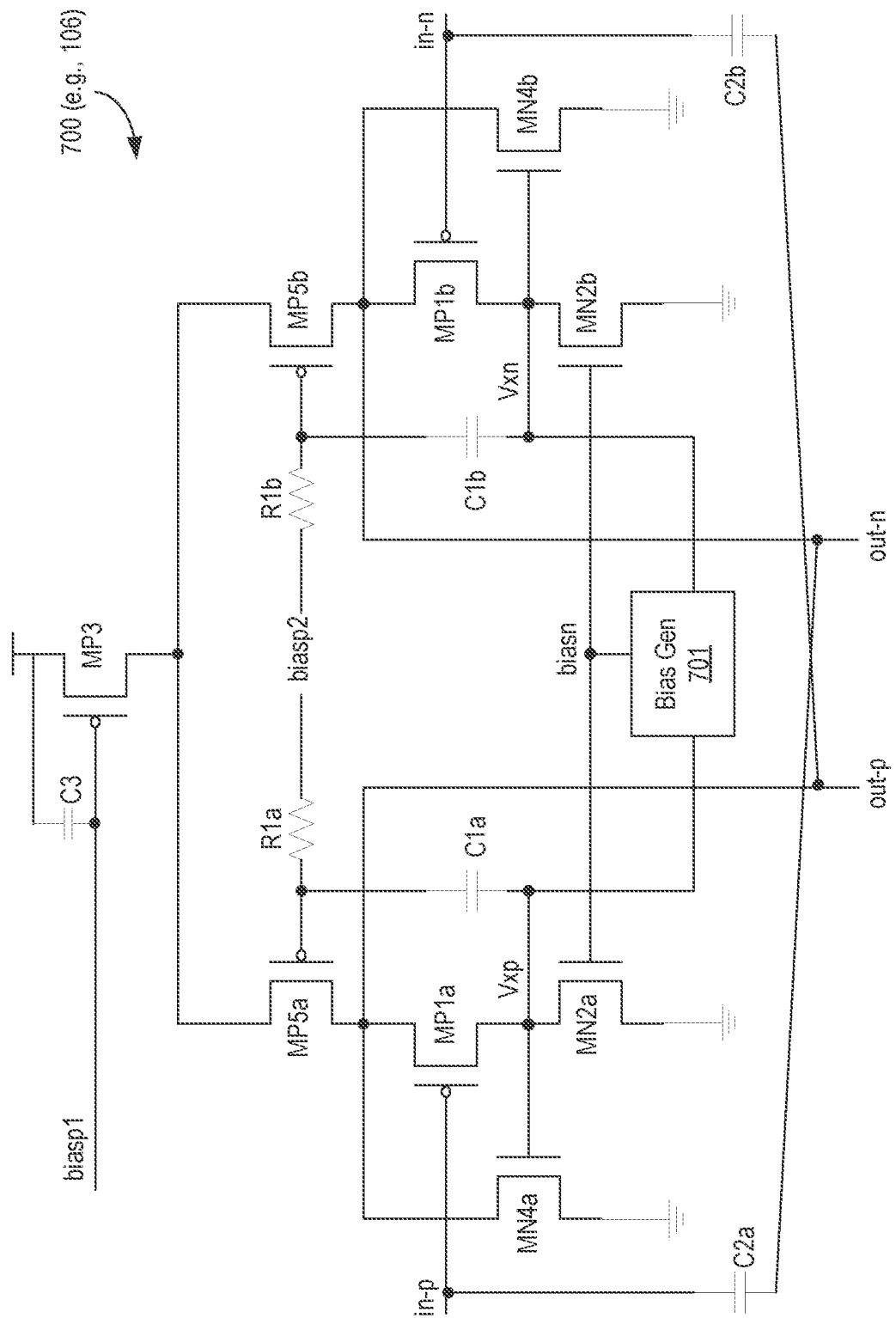
FIG. 7 illustrates a schematic of a differential source follower buffer, in accordance with some embodiments.

In various embodiments, a differential amplifier or source follower as discussed with reference to FIG. 7, is used for implementing buffer 106 (e.g., $106_{1-N}$). In the differential source follower, in some embodiments, to keep devices at a proper operating mode, a bias feedback loop is added to balance bias voltages provided to p-type and n-type transistors. As a result, power of 2× reduction is realized compared to a single-ended source follower.

FIG. 4B illustrates a timeframe 420 showing the convergence ends of buffer $106_2$ at the sampling moment, for example, the falling edge of the control signal of track and hold circuitry $107_1$. Apart from an apparent requirement to minimize its power consumption, buffer 106 (e.g., $106_2$) minimizes (or reduces) its impact on the signal it transfers. The signal quality is maintained under the following criteria:

First, the noise injected from the power supply Vcc, is minimized. For example, given a supply noise ΔVcc, the ratio to the induced output voltage change, PSRR=ΔVcc/ΔVout is maximized. Second, the bandwidth of buffer 106 is sufficiently high to enable charging $T\&H_2$ sampled capacitor $C_o$ and to prevent memory effects.

As described in FIG. 4B, the allowed timeframe for convergence of the voltage on the output capacitor of $T\&H_2$ 107 (e.g., $107_1$) is approximately 6 Unit Intervals (UI), from the instant the signal reaches the input to $T\&H_1$ (e.g., $105_2$) to the instant when the Track phase of $T\&H_2$ ends (e.g., $\Phi_2$ falling edge). If the BW (bandwidth) of buffer 106 is limited, the charge from the last symbol stored on the capacitor will impact the new symbol's charge. In this example, this effect is coined "tap 64 ISI (inter-symbol interference)", since each $T\&H_2$ samples a new symbol every 64 UIs. For different number (e.g., X) of sub-ADCs, each $T\&H_2$ samples a new symbol every X UIs. To avoid such impact, buffer 106 is implemented as a differential source follower as described with reference to FIG. 7.

Third criteria is that, another type of ISI might be observed due to buffer 106 if a traditional SF is used. This ISI, coined "FME", is seen on a buffer driven by a capacitor, as is the case for buffer 106 during the Hold phase of $T\&H_1$ (e.g., $\Phi_{1,x}$)

Figure 5:
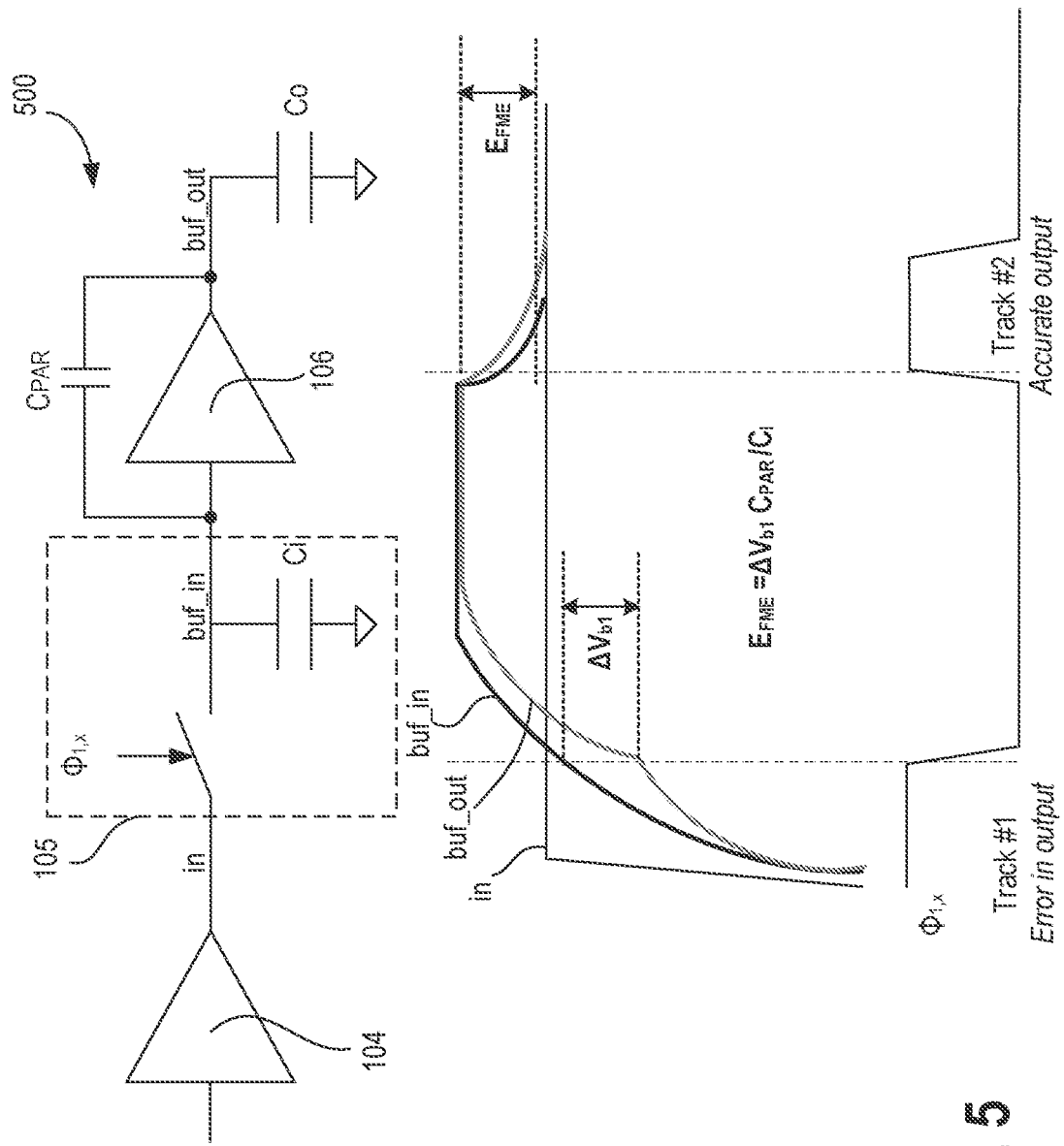
FIG. 5 illustrates a timing diagram showing the feedback-induced memory effect (FME) of a prior art buffer driven by track and hold circuitries.

FIG. 5 illustrates a timing diagram 500 showing an issue of low bandwidth of a prior art buffer driven by track and hold circuitries. As is described in FIG. 5, if buffer 106 has not completed its convergence during $T\&H_1$ Track phase, the buffer's output node will continue to charge also during the $T\&H_1$ Hold phase, while the input is held on the capacitance $C_i$. The parasitic capacitance $C_{PAR}$ between the input and the output terminals of the buffer couples these nodes together such that buf_in node is dragged together with buf_out node. This phenomena is referred to as FME. Assume $\Delta V_{b1}$ is the voltage across the buffer at Track #1 falling edge and that the buffer's gain is approximately 1, then the voltage error on the buffer's output, $E_{FMR}$, is given by:

$$E_{FME} = \Delta V_{b1} \frac{c_{PAR}}{c_i} \quad (1)$$

This results in an extra "gain", which is translated to ISI, as it depends on the signal. A large signal transition results in large $\Delta V_{b1}$ while if there is no transition, $\Delta V_{b1}$ is approx. 0. The error is shown between a symbol and the symbol that appears 8 symbols later, since it is induced between 2 consecutive track phases of $T\&H_1$. To mitigate this ISI, in various embodiments, buffer 106 is implemented as a differential source follower as described with reference to FIG. 7.

Figure 6:
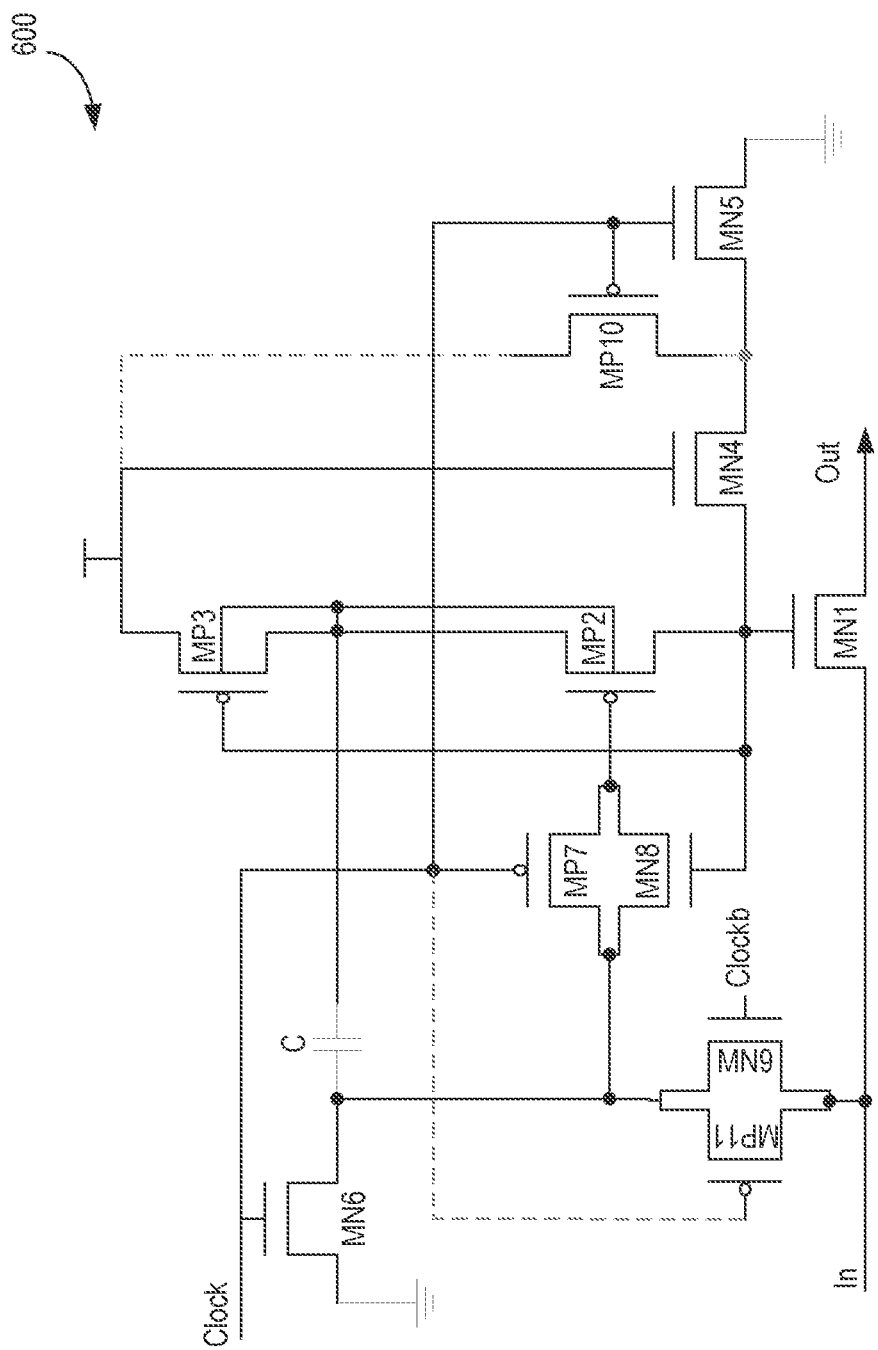
FIG. 6 illustrates an enhanced bootstrapped tack and hold circuitry, in accordance with some embodiments.

FIG. 6 illustrates an enhanced bootstrapped tack and hold circuitry 600 (e.g., one of $T\&H_1$ 105 and/or $T\&H_2$ 107), in accordance with some embodiments. Circuitry 600 comprises n-type transistors MN1, MN2, MN5, MN6, MN8, and MN9; p-type transistors MP2, MP3, MP7, MP10, and MP11; capacitor C (e.g., $C_i$ or $C_o$), clock nodes Clock and Clockb (where Clockb provides a clock which is an inverse of clock); input node In; and output node Out coupled together as shown. To improve the linearity of the track and hold circuitry, circuit 600 operates with track time of multiple UIs (e.g., 2UI) and with high bandwidth (e.g., higher than 28 GHz). Devices MP10 and MP11 improve the rise and fall time of the switch gate, in accordance with various embodiments. The clocks are Φeven, Φodd, Φ2,x, depending on the use of T&H circuitry as the first or second T&H circuitry.

FIG. 7 illustrates a schematic of a differential source follower buffer 700, in accordance with some embodiments. Buffer 700 comprises a differential source follower. The differential source follower (e.g., a class AB source follower) comprises a first half and a second half. Here, two separate amplifiers are integrated into one differential topology. The first half includes n-type transistors MN2a, MN4a, and p-type transistor MP1a coupled as shown. The second half includes n-type transistors MN2b, MN4b, and p-type transistor MP1b coupled as shown. A first input in-p is coupled to the gate of MP1a of the first half, while a second input in-n is coupled to the gate of MP1b, Here, in-p and in-n together form a differential input signal.

Buffer 700 further comprises first and second current steering devices coupled to the differential source follower. The first current steering device comprises p-type transistor MP5a which is coupled to the first half of the differential source follower. For example, transistor MP5a is coupled in series with MP1a. The second current steering device comprises p-type transistor MP5b which is coupled to the second half of the differential source follower. For example, transistor MP5b is coupled in series with MP1b. The current devices are biased by biasp2. In some embodiments, biasp2 is provided to the gate of MP5a via resistor R1a, while biasp2 is provided to the gate of MP5b via resistor R1b.

Buffer 700 comprises a current source (e.g., p-type transistor MP3) coupled to the first and second current steering devices. Transistor MP3 is the main current source in circuit 700, and this current source determines the overall current in circuit 700.

Transistors MP5a and MP5b determine whether current from MP3 flows to the positive or to the negative branch, assuming that the input signal is differential. For example, when In-n goes low, voltage on node Vxn goes high, |Vgs| of MP5b drops so less current flows to the load on out-n node, helping it to discharge. At the same time, out-p goes high, voltage on node Vxp goes low, |Vgs| of MP5a increases and more current flows to the load on out-p, helping it to charge.

In various embodiments, buffer 700 comprises: a first capacitor C1a coupled to the first current steering device MP5a and the differential source follower. For example, capacitor C1a is also coupled to the gate of MN4a. The gate node of MN4a is Vxp. In various embodiments, buffer 700 comprises: a second capacitor C1b coupled to the second current steering device MP5b and the differential source follower. For example, capacitor C1b is also coupled to the gate of MN4b. The gate node of MN4b is Vxn.

In various embodiments, buffer 700 includes a bias generation circuitry 701 which provides biasn to transistors MN2a and MN2b. One such embodiment of bias generation circuitry 701 is illustrated with reference to FIG. 8. Referring back to FIG. 7, buffer 700 comprises a third capacitor C2a coupled to the first input in-p and the second current steering device MP5b. In some embodiments, buffer 700 comprises a fourth capacitor C2b coupled to second input and the second current steering device MP5a, wherein the fourth capacitor C2b which is coupled to a first output out-p, and wherein the third capacitor C2a is coupled to a second output out-n.

In some embodiments, buffer 700 comprises a fifth capacitor C3 coupled to a gate terminal and a source terminal of the current source MP3. The gate of MP3 is also coupled to a bias, biasp1 to provide a stable current source.

Differential source follower 700 separates the AC and the DC functions to three different transistors, MP3, MP5a, and MP5b. Current source MP3 has no impact on the small-signal output resistance of the circuit. As such, the gate of MP3 is strongly coupled to the power supply, through capacitor C3. This coupling results in a close-to-constant Vgs of transistor MP3 in high and medium frequencies, such that even in the presence of supply noise, the current through transistor MP3 is close to constant, thereby significantly improving the PSRR of circuit 700. Apart from this coupling, the circuit is differential, and thus any noise that is not suppressed by this coupling is mostly translated to a common mode noise on the differential signal out-p-out-n, such that the differential PSRR is further increased. During a small signal analysis of the circuit, the drain node of transistor MP3 is considered a virtual ground.

The differential source follower circuit 700 also results in the rejection of FME. Capacitors C2a and C2b couple between each input and its inverted output, and thus cancel the effect of $C_{PAR}$ of FIG. 5. Referring back to FIG. 7, at first order, the FME is a linear effect, having the same impact on a rising and on a falling signal. For example, the negative FME on a falling in-n has the same magnitude as the positive FME on a rising in-p. Thus, cross capacitors (C2a/b) between out-p to in-n and out-n to in-p with the same size as $C_{PAR}$ may completely cancel the FME, such that equation 1 is reduced to:

$$E_{FME} = \Delta V_{b1} \frac{C_{PAR}}{C_i} - \Delta V_{b1} \frac{C_2}{C_i} = 0 \tag{2}$$

Here for circuit 700, $C_{PAR}$ is approximately the parasitic capacitance between the gate and the source terminals of MP1a/b transistors, and thus is a variable, PVT (process, voltage, and temperature) and signal dependent capacitance. Additionally, FME is not fully linear at large signal. Thus, in an actual implementation, $E_{FME}$ may not be fully cancelled. Simulations, show that with C2a and C2b implemented as metal-finger capacitors, even at the largest supported input signal, FME drops to less than 40% of its value without the capacitors, for example.

Differential source follower 700 provides DC regulation to the voltages on Vxn and Vxp by introducing a DC regulation loop to Vxn and Vxp nodes. This loop is described in FIG. 8.

Figure 8:
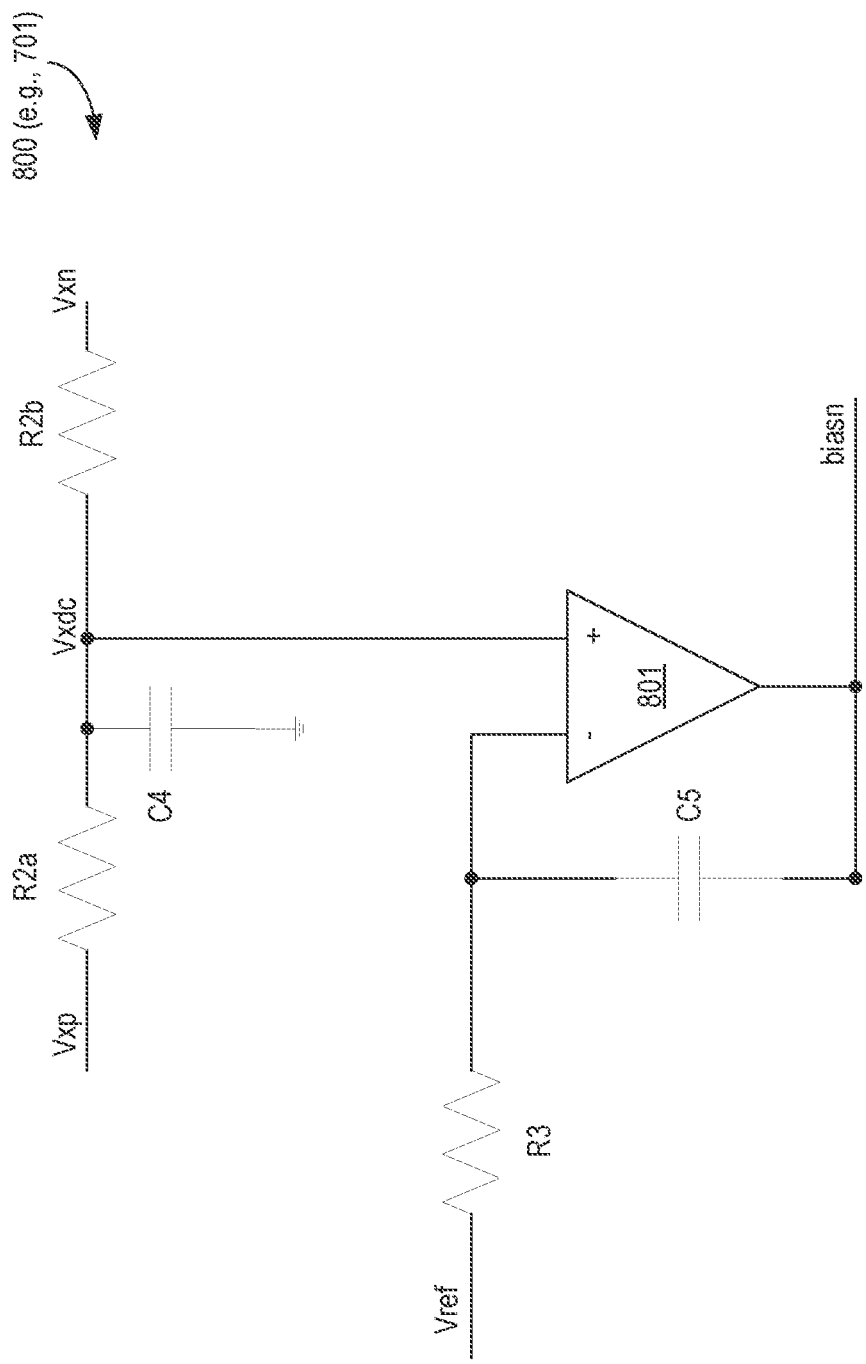
FIG. 8 illustrates a bias generator for the differential source follower buffer of FIG. 7, in accordance with some embodiments.
Figure 9:
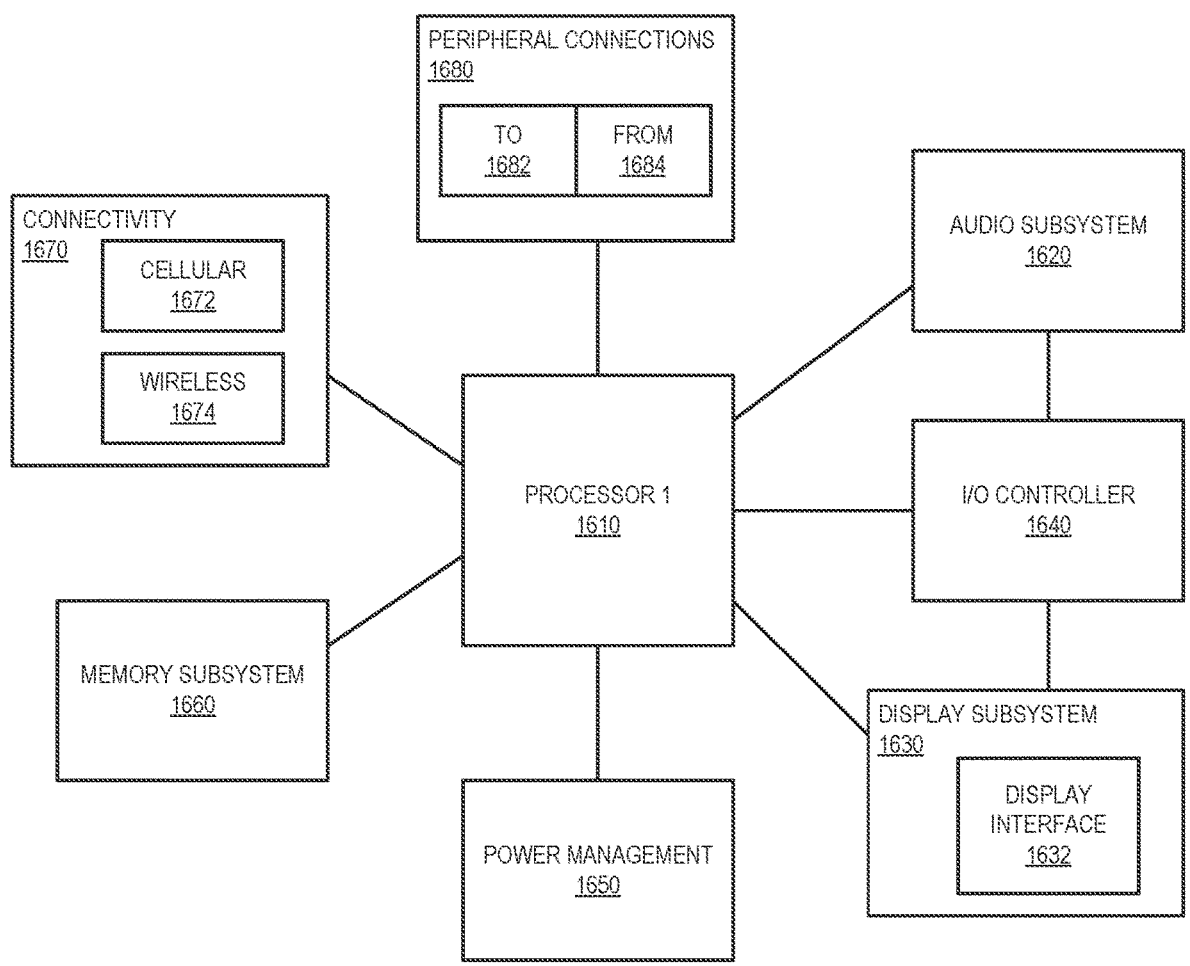
FIG. 9 illustrates a smart device or a computer system or a SoC (System-on-Chip) with a differential buffer having high bandwidth and high PSRR, according to some embodiments of the disclosure.

FIG. 8 illustrates a bias generator 800 (e.g., 701) for the differential source follower buffer 700, in accordance with some embodiments. Bias generator 800 comprises resistors R2a, R2b, and R3, amplifier 801, and capacitors C4 and C4 coupled together as shown. The voltages on nodes Vxn and Vxp are filtered through resistors R2a/b and capacitor C4, to generate their average DC voltage on Vxdc node. Biasn node is driven by amplifier 801, which together with resistor R3 and capacitor C5 forms an integrator. This integrator loop minimizes the difference between the voltage on node Vxdc and a voltage on reference node, Vref, which is generated by an external bias-generation circuit, in accordance with some embodiments. This Vxn/p regulation adapts the current through transistors MN2a/b to the current driven by current source MP3, as well as keeps transistors MN4a/b in the saturation region.

The capacitors and resistors of various embodiments can be implemented as discrete devices, transistors, metal fingers, etc. For example, capacitors can be implemented as metal fingers and/or transistors. The capacitors and/or resistors can be formed in the frontend of the die or the backend of the die.

FIG. 10 illustrates a smart device, a computer system, or a SoC (System-on-Chip) with a differential buffer having high bandwidth and high PSRR, according to some embodiments of the disclosure. FIG. 10 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with a differential buffer (e.g., circuit 700) having high bandwidth and high PSRR, according to some embodiments discussed. Other blocks of the computing device 1600 may also include a differential buffer (e.g., circuit 700) having high bandwidth and high PSRR, according to some embodiments.

The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments are illustrated as examples. These each example can be combined with any other example where suitable. Some examples are described here.

Example 1: An apparatus comprising: a differential source follower coupled to a first input and a second input; first and second current steering devices coupled to the differential source follower; and a current source coupled to the first and second current steering devices.

Example 2: The apparatus of example 1, comprising: a first capacitor coupled to the first current steering device and the differential source follower; and a second capacitor coupled to the second current steering device and the differential source follower.

Example 3: The apparatus of example 2 comprising a bias generator to generate bias for the differential source follower.

Example 4: The apparatus of example 3 comprising: a third capacitor coupled to the first input and the second current steering device; and a fourth capacitor coupled to second input and the second current steering device, wherein the fourth capacitor is coupled to a first output, and wherein the third capacitor is coupled to a second output.

Example 5: The apparatus of example 1, wherein the differential source follower comprises a differential class AB source follower.

Example 6: The apparatus of example 5, wherein the current source is a p-type current source, and wherein the apparatus comprises a fifth capacitor coupled to a gate terminal and a source terminal of the current source.

Example 7: The apparatus of example 4, wherein the differential source follower comprises: a source follower comprising: a p-type device coupled in series with the first current steering device, and also coupled to the first input; and an n-type device coupled in series with the p-type device, wherein the n-type device is biased by the bias from the bias generator, wherein drain terminals of the p-type and the n-type devices are coupled to the first capacitor.

Example 8: The apparatus of example 7, wherein the source follower is a first source follower, wherein the differential source follower comprises a second source follower which includes: a p-type device coupled in series with the second current steering device, and also coupled to the second input; and an n-type device coupled in series with the p-type device, wherein the n-type device is biased by the bias from the bias generator, wherein drain terminals of the p-type and the n-type devices are coupled to the second capacitor.

Example 9: The apparatus of example 2, wherein a gate terminal of the first current steering device is coupled to a first resistor, which is coupled to a bias.

Example 10: The apparatus of example 9, wherein a gate terminal of the second current steering device is coupled to a second resistor, which is coupled to the bias.

Example 11: The apparatus of example 8, wherein the n-type transistor of the first source follower is a first n-type transistor, wherein the first source follower comprises a second n-type transistor having a gate terminal coupled to the first capacitor and a drain terminal coupled to the first output.

Example 12: The apparatus of example 8, wherein the n-type transistor of the second source follower is a first n-type transistor, wherein the second source follower comprises a second n-type transistor having a gate terminal coupled to the second capacitor and a drain terminal coupled to the second output.

Example 13: An apparatus comprising: a differential analog front-end; a differential track and hold circuitry coupled to an output of the differential analog front-end; and a buffer coupled to an output of the differential track and hold circuitry, wherein the buffer comprises: a differential source follower coupled to a first input and a second input, wherein the first and second inputs are first and second outputs of the differential track and hold circuitry, respectively; first and second current steering devices coupled to the differential source follower; and a current source coupled to the first and second current steering devices.

Example 14: The apparatus of example 13, wherein the differential track and hold circuitry is a first differential track and hold circuitry, wherein the apparatus comprises a second differential track and hold circuitry coupled to first and second output of the differential source follower.

Example 15: The apparatus of example 14 comprising an analog-to-digital converter (ADC) coupled to the second differential track and hold circuitry.

Example 16: The apparatus of example 15 comprising a feed-forward equalizer coupled to an output of the ADC.

Example 17: The apparatus of example 16 comprising a decision feedback equalizer coupled to an output of the feed-forward equalizer.

Example 18: The apparatus of example 17 comprising a clock data recovery (CDR) circuitry coupled to the feed-forward equalizer and the decision feedback equalizer.

Example 19: The apparatus of example 13, comprising: a first capacitor coupled to the first current steering device and the differential source follower; a second capacitor coupled to the second current steering device and the differential source follower; and a bias generator to generate bias for the differential source follower.

Example 20: A system comprising: a memory; a processor coupled to the memory, wherein the processor includes a buffer which includes: a differential source follower coupled to a first input and a second input; first and second current steering devices coupled to the differential source follower; and a current source coupled to the first and second current steering devices; and a wireless interface to allow the processor to communicate with another device.

Example 21: The system of example 20, wherein the buffer comprises: a first capacitor coupled to the first current steering device and the differential source follower; and a second capacitor coupled to the second current steering device and the differential source follower.

Example 22: The system of example 21, wherein the buffer comprises: a third capacitor coupled to the first input and the second current steering device; and a fourth capacitor coupled to second input and the second current steering device, wherein the fourth capacitor is coupled to a first output, and wherein the third capacitor is coupled to a second output.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
an analog front-end;
first track and hold circuitry coupled to an output of the analog front-end; and
a buffer coupled to an output of the first track and hold circuitry, wherein the buffer comprises a differential source follower and a bias generator, the differential source follower comprises first and second halves, and the bias generator is to bias the first and second halves of the differential source follower with a bias feedback loop, wherein:
the first half of the differential source follower comprises, as a first input, a first output of the first track and hold circuitry;
the second half of the differential source follower comprises, as a second input, a second output of the first track and hold circuitry; and
the apparatus further comprises second track and hold circuitry coupled to a first output of the first half of the differential source follower and to a second output of the second half of the differential source follower.

2. The apparatus of claim 1, further comprising:
an analog-to-digital converter (ADC) coupled to the second track and hold circuitry;
a feed-forward equalizer coupled to an output of the ADC;
a decision feedback equalizer coupled to an output of the feed-forward equalizer; and
a clock data recovery circuitry coupled to the feed-forward equalizer.

3. The apparatus of claim 1, further comprising:
a first current steering device coupled to the first half of the differential source follower;
a second current steering device coupled to the second half of the differential source follower; and
a current source coupled to the first and second current steering devices.

4. The apparatus of claim 3, further comprising:
a path which couples a control gate of the first current steering device to a first input of the bias generator; and
a path which couples a control gate of the second current steering device to a second input of the bias generator;

wherein the bias generator is to generate a common bias for the first and second halves of the differential source follower based on voltages on the first and second inputs of the bias generator.

5. The apparatus of claim 4, wherein:
the bias generator comprises an amplifier having first and second inputs and an output;
the bias generator is to obtain an average of the voltages on the first and second inputs of the bias generator at the first input to the amplifier;
a reference voltage is coupled to the second input of the amplifier; and
the common bias is the output of the amplifier.

6. The apparatus of claim 4, wherein:
the first current steering device is in series with a first transistor;
the second current steering device is in series with a second transistor; and
the bias generator is to generate the common bias for the first and second halves of the differential source follower at control gates of the first and second transistors.

7. The apparatus of claim 4, wherein:
the first current steering device is in series with a first transistor;
the second current steering device is in series with a second transistor;
a control gate of the first transistor is coupled to an input of the first half of the differential source follower; and
a control gate of the second transistor is coupled to an input of the second half of the differential source follower.

8. An apparatus comprising:
an analog front-end;
first track and hold circuitry coupled to an output of the analog front-end;
a first half of a differential source follower comprising a first input coupled to a first output of the first track and hold circuitry;
a second half of the differential source follower comprising a second input coupled to a second output of the first track and hold circuitry;
a first current steering device coupled to the first half of the differential source follower;
a second current steering device coupled to the second half of the differential source follower; and
a bias generator to generate a common bias for the first and second halves of the differential source follower based on a voltage on a control gate of the first current steering device and a voltage on a control gate of the second current steering device, wherein:
the voltage on the control gate of the first current steering device is obtained from a bias voltage provided via a respective resistor coupled to the control gate of the first current steering device; and
the voltage on the control gate of the second current steering device is obtained from a bias voltage provided via a respective resistor coupled to the control gate of the second current steering device.

9. The apparatus of claim 8, further comprising:
second track and hold circuitry coupled to a first output of the first half of the differential source follower and to a second output of the second half of the differential source follower; and
an analog-to-digital converter (ADC) coupled to the second track and hold circuitry.

10. The apparatus of claim 8, wherein:
the first current steering device is in series with a first transistor of the first half of the differential source follower;
the second current steering device is in series with a second transistor of the second half of the differential source follower; and
the bias generator is to generate the common bias for the first and second halves of the differential source follower at control gates of the first and second transistors.

11. The apparatus of claim 10, wherein:
the first current steering device is in series with a third transistor;
the second current steering device is in series with a fourth transistor;
a control gate of the third transistor is coupled to the first input of the first half of the differential source follower; and
a control gate of the fourth transistor is coupled to the second input of the second half of the differential source follower.

12. The apparatus of claim 11, wherein:
the first input of the first half of the differential source follower is coupled to the first output of the first track and hold circuitry; and
the second input of the second half of the differential source follower is coupled to the second output of the first track and hold circuitry.

13. The apparatus of claim 8, wherein:
the bias generator comprises an amplifier having first and second inputs and an output;
the bias generator is to obtain an average voltage at the first input of the amplifier based on the voltage on the control gate of the first current steering device and the voltage on the control gate of the second current steering device;
a reference voltage is coupled to the second input of the amplifier via a resistor; and
the common bias is the output of the amplifier.

14. The apparatus of claim 13, wherein:
the average is an average DC voltage; and
to obtain the average, the bias generator is to filter a voltage on a path coupled to the control gate of the first current steering device via a respective capacitor with a first resistor and to filter a voltage on a path coupled to the control gate of the second current steering device via a respective capacitor with a second resistor.

15. An apparatus comprising:
first and second halves of a differential source follower, the first half of the differential source follower comprising a first input coupled to a first output of a first track and hold circuit and the second half of the differential source follower comprising a second input coupled to a second output of the first track and hold circuit;
a first current steering device coupled to the first half of the differential source follower;
a second current steering device coupled to the second half of the differential source follower, wherein:
the first current steering device is coupled to ground by a first transistor of the first half of the differential source follower; and
the second current steering device is coupled to ground by a second transistor of the second half of the differential source follower; and a bias generator to generate a common bias for control gates of the first and second transistors based on voltages on control gates of the first and second current steering devices, wherein:
- to generate the common bias, the bias generator is to minimize a difference between an average voltage and a voltage at a reference node; and
- the average voltage is based on the voltages on the control gates of the first and second current steering devices.

16. The apparatus of claim 15, wherein:
the bias generator comprises an integrator loop to minimize the difference between the average voltage and the voltage at the reference node.

* * * * *